US012309935B2

(12) United States Patent
Kao

(10) Patent No.: US 12,309,935 B2
(45) Date of Patent: May 20, 2025

(54) HIGH CAPACITANCE MEMORY DEVICE

(71) Applicant: INNODISK CORPORATION, New Taipei (TW)

(72) Inventor: Chih-Chieh Kao, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 245 days.

(21) Appl. No.: 18/326,029

(22) Filed: May 31, 2023

(65) Prior Publication Data

US 2024/0357745 A1 Oct. 24, 2024

(30) Foreign Application Priority Data

Apr. 20, 2023 (TW) ................................ 112114712

(51) Int. Cl.

*H05K 1/18* (2006.01)
*H05K 1/02* (2006.01)
*H05K 1/11* (2006.01)

(52) U.S. Cl.

CPC .......... *H05K 1/181* (2013.01); *H05K 1/0203* (2013.01); *H05K 1/111* (2013.01); *H05K 2201/066* (2013.01); *H05K 2201/10015* (2013.01); *H05K 2201/10159* (2013.01)

(58) Field of Classification Search

CPC ...... H05K 1/181; H05K 1/0203; H05K 1/111; H05K 2201/066; H05K 2201/10015; H05K 2201/10159; H05K 1/0231

See application file for complete search history.

(56) References Cited

U.S. PATENT DOCUMENTS

| | | | | |
|---|---|---|---|---|
| 6,608,257 B1 * | 8/2003 | St. Cyr | H05K 1/0231 | 174/255 |
| 2008/0003883 A1 * | 1/2008 | Ni | H05K 1/117 | 439/83 |
| 2009/0231818 A1 * | 9/2009 | Yu | H05K 1/18 | 174/260 |
| 2021/0035738 A1 * | 2/2021 | Goh | H01G 4/005 | |

* cited by examiner

*Primary Examiner* — Sherman Ng

(57) ABSTRACT

A high capacitance memory device comprises a printed circuit board provided with a plurality of metal connection pads and at least one capacitor core is arranged on the printed circuit board. The capacitor core has connection pins and is electrically connected to the metal connection pads through a conductive glue. An adhesive layer covers the capacitor core. A memory module is set on the printed circuit board and electrically connected to the capacitor core.

7 Claims, 6 Drawing Sheets

340

30 20 20a 20b 200 40 42

10a 50 20 30 150 10 10b 20 30 152

HIGH CAPACITANCE MEMORY DEVICE

CROSS-REFERENCE TO RELATED APPLICATION

This non-provisional application claims priority under 35 U.S.C. § 119 (a) on Patent Application No(s). 112114712 filed in Taiwan, R.O.C. on Apr. 20, 2023, the entire contents of which are hereby incorporated by reference.

BACKGROUND OF THE INVENTION

1. Field of the Invention

The present disclosure relates to a memory device, and in particular to a high capacitance memory device.

2. Description of the Related Art

A tantalum polymer capacitor is an electrolyte-free solid capacitor made of metal tantalum and features advantages of a small volume and outstanding performance, and is thus currently one of the most suitable components available for backup power supply applications.

In solid state drive (SSD) applications, in the event of an abnormal power interruption of a system, an SSD controller needs an additional backup power supply to securely write data in a buffer into a flash memory, so as to prevent loss of data. Accompanied with the evolving technologies of flash memories, the transmission speed continues to increase such that power consumption also gets larger, leading to greater power capacity demands of backup power supplies.

In general, requirements for a large power capacity for backup power supplies can be met by means of increasing the capacitance of tantalum polymer capacitors and increasing the charging voltage. However, increasing the capacitance and increasing the charging voltage both enlarge the volume and size of tantalum polymer capacitors. In a package structure of a tantalum polymer capacitor, structures including a tantalum core, a molded housing, a positive lead frame, and a negative lead frame are included, and thus yield a larger volume and occupy a large space as well.

BRIEF SUMMARY OF THE INVENTION

When the height of electronic components is limited to standardization, it is difficult for current tantalum polymer capacitors to meet design requirements for miniaturization. In addition, when a heat sink is installed on a memory of an SSD, due to different heights of components of a tantalum polymer capacitor and heights of components of the memory, the heat sink may fail to come into contact in a flat and uniform manner with surfaces of the tantalum polymer capacitor and the memory, thereby undesirably affecting heat dissipation efficiency.

On the basis of the reasons above, the applicant has developed a high capacitance memory device, which can solve the problem that the height of electronic components is limited by standardization and further solve the issue concerning flat and uniform installation of a heat sink.

To achieve the above and other objectives, the present disclosure provides a high capacitance memory device, including: a printed circuit board, provided with a plurality of metal connection pads; at least one capacitor core, arranged on the printed circuit board, the at least one capacitor core having connection pins and being electrically connected to the metal connection pads via a conductive glue; an adhesive layer, covering the at least one capacitor core; and a memory module, arranged on the printed circuit board and electrically connected to the at least one capacitor core.

In some embodiments, the adhesive layer is an epoxy resin.

In some embodiments, the capacitor cores are disposed by means of Chip On Board (COB) technology on the printed circuit board.

In some embodiments, the printed circuit board is further provided thereon with a power control module, and the power control module is covered along with the capacitor cores by the adhesive layer.

In some embodiments, a heat sink in contact with surfaces of the memory module and the adhesive layer is further included.

In some embodiments, the material of the conductive glue is selected from a group consisting of silver glue, copper glue, tin glue, and platinum glue.

In some embodiments, the capacitor cores are respectively arranged on different surfaces of the printed circuit board.

In some embodiments, each of the capacitor cores is simultaneously arranged on a different surface of the printed circuit board.

Thus, as the high capacitance capacitor does not include structures such as a molded housing, a positive lead frame, or a negative lead frame, the space occupied by the lead frames can be eliminated from the high capacitance memory device of the present disclosure, and thus smaller volume size and height are provided to thereby solve the problem that the height of electronic components is limited to standardization and to meet design requirements for miniaturization. In addition, because the overall height of the high capacitance capacitor can be adjusted based on the number of capacitor cores and the thickness of the adhesive layer, the height of the high capacitance capacitor can be substantially consistent with the height of the memory module. Accordingly, a heat sink is allowed to come into contact in a flat and uniform manner with surfaces of the memory module and the high capacitance capacitor, hence improving heat dissipation efficiency.

DETAILED DESCRIPTION OF THE INVENTION

To facilitate understanding of the objectives, characteristics, and effects of this present disclosure, embodiments together with the attached drawings for the detailed description of the present disclosure are provided.

Figure 1:
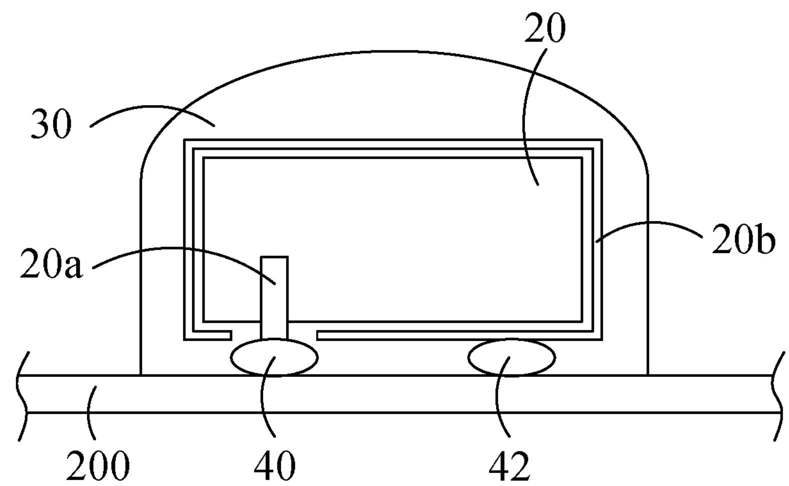
FIG. 1 is a structural schematic diagram of a high capacitance capacitor according to an embodiment of the present disclosure.

Refer to FIG. 1, which shows a structural schematic diagram of a high capacitance capacitor according to an embodiment of the present disclosure. A high capacitance capacitor 150 is arranged on a printed circuit board 10. The high capacitance capacitor 150 includes a capacitor core 20, a first connection pin 20*a*, a second connection pin 20*b*, an adhesive layer 30, a conductive glue 40, and a conductive glue 42.

The capacitor core 20 is made of metal tantalum as an anode material. In some embodiments, the capacitor core 20 is made of aluminum or other materials as an anode material. The first connection pin 20*a*, facing downward and exposed outside the capacitor core 20, is provided in the capacitor core 20. The first connection pin 20*a* serves as an anode. The second connection pin 20*b* is provided on an outer periphery of the capacitor core 20. The second connection pin 20*b* serves as a cathode. An insulating layer (not shown) may be arranged on a periphery of the first connection pin 20*a* exposed outside the capacitor core 20, so as to prevent the first connection pin 20*a* and the conductive glue 40 from contact with the second connection pin 20*b* that may lead to a problem of short-circuitry. Similarly, an insulating layer (not shown) may be arranged on a periphery of the capacitor core 20, the interior of the second connection pin 20*b*, or both around the outer surface of the capacitor core 20 and the interior surface of the second connection pin 20*b*, so as to prevent the capacitor core 20 from coming into contact with the second connection pin 20*b* that may lead to a problem of short-circuitry. The first connection pin 20*a* is electrically connected to a metal connection pad 12 via the conductive glue 40, such that the metal connection pad 12 serves as an anode. The second connection pin 20*b* is electrically connected to a metal connection pad 14 via the conductive glue 42, such that the metal connection pad 14 serves as a cathode.

The adhesive layer 30 covers the capacitor core 20 and the second connection pin 20*b*. The adhesive layer 30 may be an epoxy resin, a polyurethane hot melt adhesive, silicone, or other suitable adhesive materials. An epoxy resin is used in this embodiment. The adhesive layer 30 may cover the capacitor core 20 and the second connection pin 20*b* by using an automatic adhesive dispensing apparatus to form a protection layer for the capacitor core 20 and the second connection pin 20*b*, so as to isolate from air, impurities, light, or moisture. Since the adhesive layer 30 has plasticity before curing, the height, thickness, or shape of the adhesive layer 30 can be adjusted according to installation space requirements, so as to meet the height restriction requirements of electronic components.

The conductive glues 40 and 42 are located between the capacitor core 20 and the printed circuit board 10. The conductive glues 40 and 42 are electrically connected to the first connection pin 20*a* and the second connection pin 20*b*, respectively. The materials of the conductive glues 40 and 42 are selected from a group consisting of silver glue, copper glue, tin glue, and platinum glue. A silver glue is used in this embodiment. Similarly, since the conductive glues 40 and 42 have plasticity before curing, the heights, thicknesses or shapes of the conductive glues 40 and 42 can be adjusted according to installation space requirements, so as to meet the height restriction requirements of electronic components.

The printed circuit board 10 is provided with the metal connection pad 12 and the metal connection pad 14. The metal connection pad 12 is electrically connected to the conductive glue 40, and the metal connection pad 14 is electrically connected to the conductive glue 42.

It should be noted that, as the high capacitance capacitor 150 does not include structures such as a molded housing, a positive lead frame, or a negative lead frame, the space occupied by the lead frames can be eliminated from the high capacitance memory device of the present disclosure, and thus smaller volume size and lower height are provided to thereby solve the problem that the height of electronic components is limited to standardization and to meet design requirements for miniaturization. Moreover, the high capacitance capacitor 150 includes multiple capacitor cores 20 to increase the capacitance so as to meet requirements of increased power capacity for backup power supplies. For example, within the same unit area, a conventional backup power supply may be provided with 5 tantalum polymer capacitors; however, the high capacitance capacitor 150 of the present disclosure may be provided with 8 capacitor cores 20, hence increasing the capacitance as well as meeting requirements of increased power capacity for backup power supplies.

Figure 2:
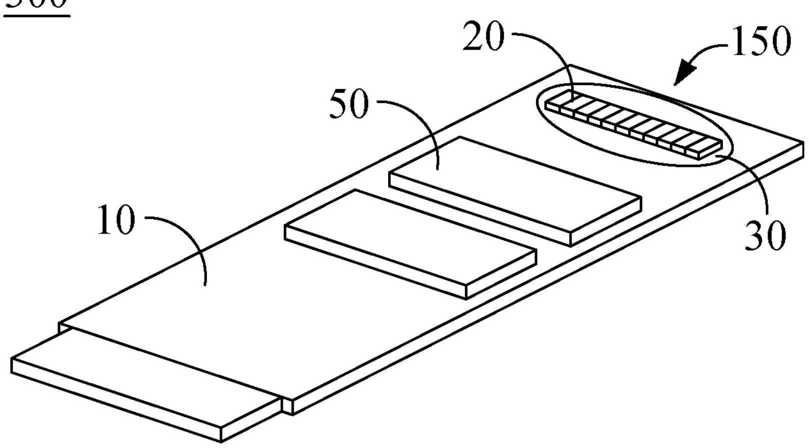
FIG. 2 is a schematic diagram of an appearance of a high capacitance capacitor according to an embodiment of the present disclosure.

Refer to FIG. 2, which shows a schematic diagram of an appearance of a high capacitance capacitor according to an embodiment of the present disclosure. A high capacitance memory device 300 includes a printed circuit board 10, a memory module 50, and a high capacitance capacitor 150. A capacitor core 20 on the high capacitance capacitor 150 is arranged by means of COB on a printed circuit board 10 to thereby enhance manufacturing convenience. The memory module 50 is, for example but not limited to, a single-level cell (SLC) NAND flash memory module, a multi-level cell (MLC) NAND flash memory module, a triple-level cell (TLC) NAND flash memory module, or a quad-level cell (QLC) NAND flash memory module.

Figure 3:
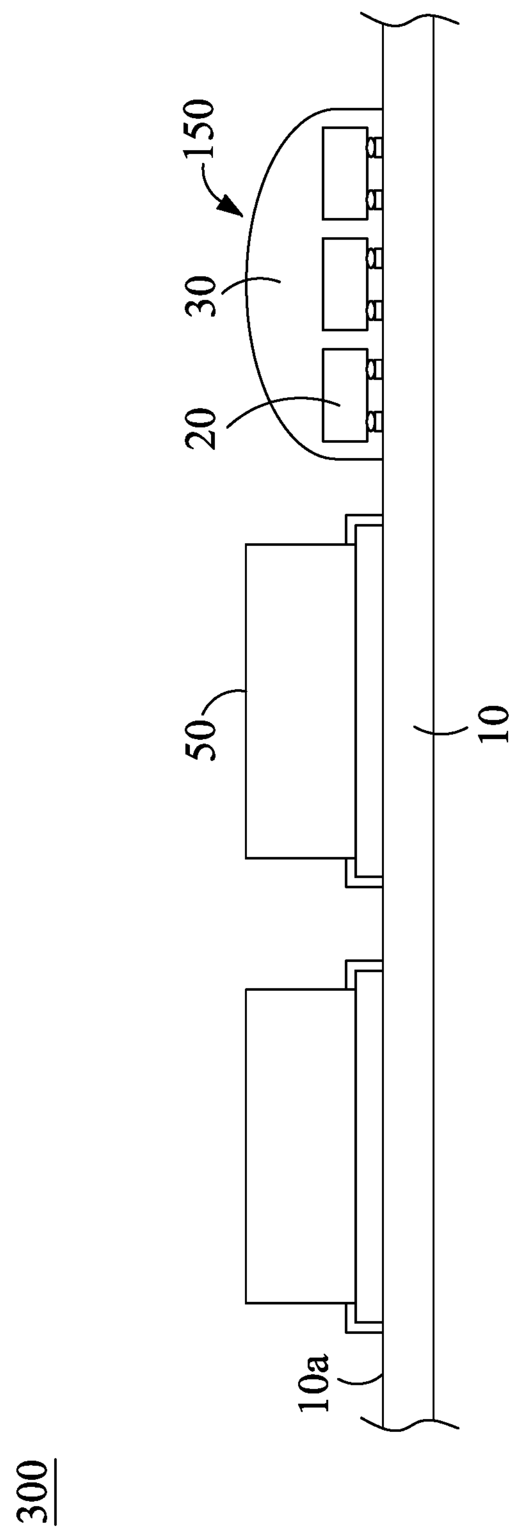
FIG. 3 is a structural schematic diagram of a high capacitance memory device according to an embodiment of the present disclosure.

Refer to FIG. 3, which shows a structural schematic diagram of a high capacitance memory device according to an embodiment of the present disclosure. A high capacitance memory device 300 includes a printed circuit board 10, a memory module 50, and a high capacitance capacitor 150. The high capacitance capacitor 150 is arranged on a first surface 10*a* of the printed circuit board 10. The high capacitance capacitor 150 includes a plurality of capacitor cores 20, which are covered by an adhesive layer 30.

Figure 4:
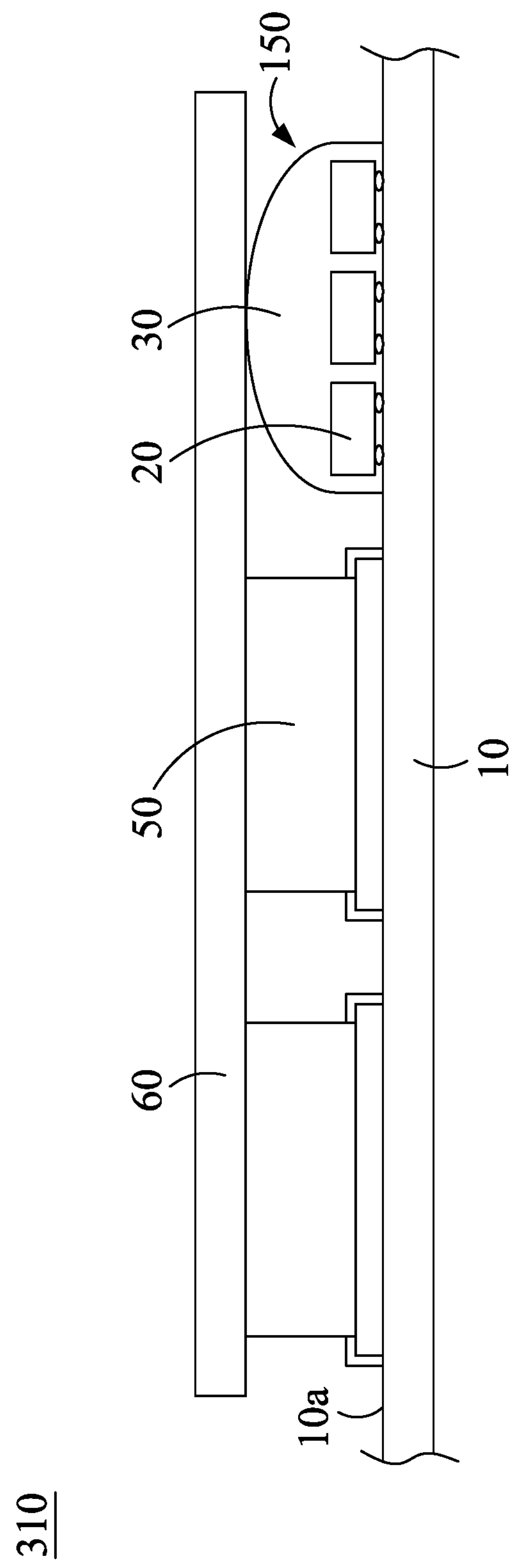
FIG. 4 is a structural schematic diagram of a high capacitance memory device installed with a heat sink according to an embodiment of the present disclosure.

Refer to FIG. 4, which shows a structural schematic diagram of a high capacitance memory device installed with a heat sink according to an embodiment of the present disclosure. A high capacitance memory device 310 includes a printed circuit board 10, a memory module 50, a heat sink 60, and a high capacitance capacitor 150. The high capacitance capacitor 150 is arranged on a first surface 10*a* of the printed circuit board 10. The heat sink 60 is installed (by means of, for example, attaching) over the memory module 50 and the high capacitance capacitor 150. More specifically, the heat sink 60 is installed over the memory module 50 and the high capacitance capacitor 150, and the heat sink 60 is in contact with surfaces of the memory module 50 and the high capacitance capacitor 150. Because the overall height of the high capacitance capacitor 150 can be adjusted based on the number of the capacitor cores 20 and the thickness of the adhesive layer 30, the height of the high capacitance capacitor 150 can be substantially consistent with the height of the memory module 50. Accordingly, the heat sink 60, when installed on the high capacitance memory device 310, is allowed to come into contact in a flat and uniform manner with the surfaces of the memory module 50 and the high capacitance capacitor 150, thereby overcoming the problem of heat dissipation undesirably affected by the heat sink 60 not being able to come into contact in a flat and uniform manner with electronic components.

Figure 5:
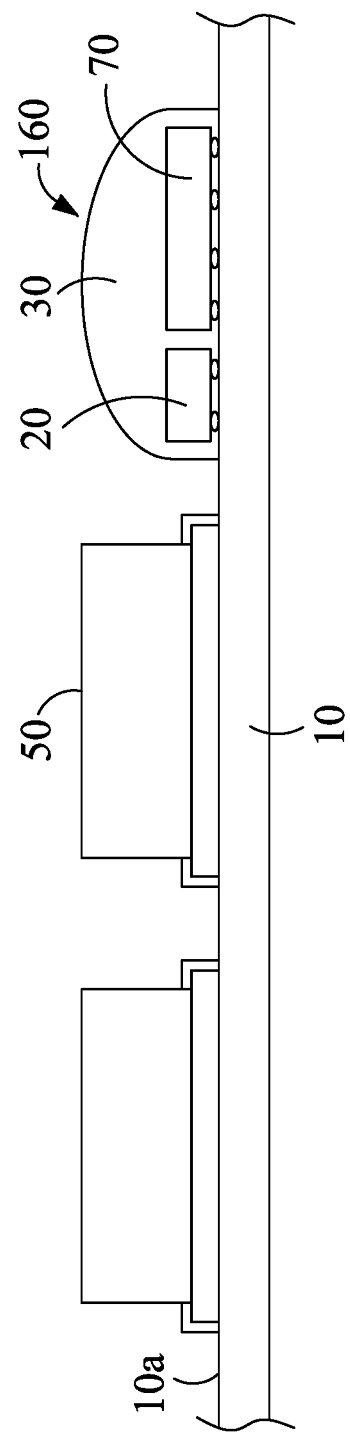
FIG. 5 is a structural schematic diagram of a high capacitance memory device according to an embodiment of the present disclosure.

Refer to FIG. 5, which shows a structural schematic diagram of a high capacitance memory device according to some embodiments of the present disclosure. A high capacitance memory device 320 includes a printed circuit board 10, a memory module 50, and a high capacitance capacitor 160. The high capacitance capacitor 160 in FIG. 5 differs from the high capacitance capacitor 150 in FIG. 3 in that, the printed circuit 10 is further arranged with a power control module 70, and the power control module 70 is covered along with the capacitor core 20 and the second connection pin 20*b* by the adhesive layer 30. The remaining details are the same as those of the embodiment in FIG. 3, and are omitted herein for brevity. Accordingly, the power control module 70 is covered by the adhesive layer 30 to isolate from air, impurities, light, or moisture.

Figure 6:
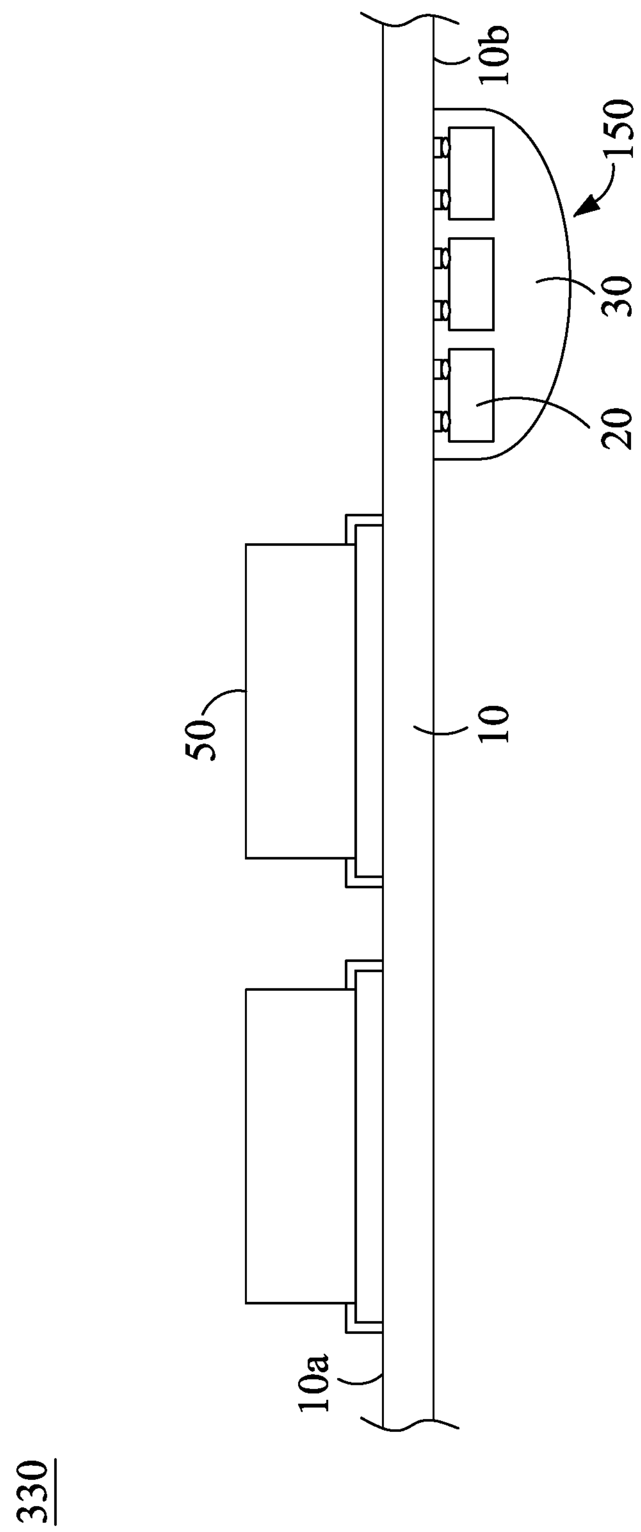
FIG. 6 is a structural schematic diagram of a high capacitance memory device according to an embodiment of the present disclosure.

Refer to FIG. 6, which shows a structural schematic diagram of a high capacitance memory device according to some embodiments of the present disclosure. A high capacitance memory device 330 includes a printed circuit board 10, a memory module 50, and a high capacitance capacitor 150. The embodiment in FIG. 6 differs from the embodiment in FIG. 3 in that, the high capacitance capacitor 150 is arranged on a second surface 10*b* of the printed circuit board 10. Accordingly, when one side of the printed circuit board 150 has a special height restriction, the requirements for the height restriction can be met by the installation means of this embodiment.

Figure 7:
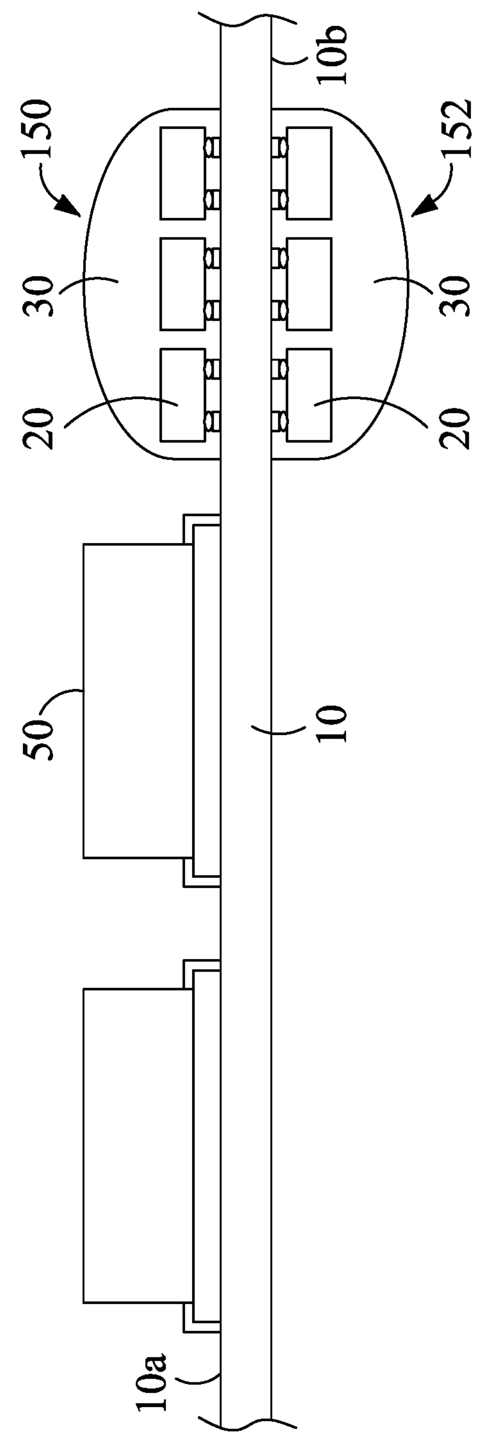
FIG. 7 is a structural schematic diagram of a high capacitance memory device according to an embodiment of the present disclosure.

Refer to FIG. 7, which shows a structural schematic diagram of a high capacitance memory device according to some embodiments of the present disclosure. A high capacitance memory device 340 includes a printed circuit board 10, a memory module 50, a high capacitance capacitor 150, and a high capacitance capacitor 152. The embodiment in FIG. 7 differs from the embodiment in FIG. 3 in that, the high capacitance capacitor 150 is arranged on a first surface 150*a* of the printed circuit board 10, and the high capacitance capacitor 152 is arranged on a second surface 10*b* of the printed circuit board 10. In other words, the capacitor cores 20 are arranged on different surfaces of the printed circuit board 10, respectively. Accordingly, when the high capacitance memory device 340 has a special power capacity requirement, the power capacity of a backup power supply can be enhanced by the installation means of this embodiment.

In conclusion, as the high capacitance capacitor does not include structures such as a molded housing, a positive lead frame, or a negative lead frame, the space occupied by the lead frames can be eliminated from the high capacitance memory device of the present disclosure compared to a conventional tantalum polymer capacitor, and thus smaller volume size and height are provided to thereby solve the problem that the height of electronic components is limited to standardization and to meet design requirements for miniaturization. In addition, because the overall height of the high capacitance capacitor can be adjusted based on the number of capacitor cores and the thickness of the adhesive layer, the height of the high capacitance capacitor can be substantially consistent with the height of the memory module. Accordingly, a heat sink is allowed to come into contact in a flat and uniform manner with surfaces of the memory module and the high capacitance capacitor, thereby improving heat dissipation efficiency.

The present invention is described by way of the preferred embodiments above. A person skilled in the art should understand that, these embodiments are merely for describing the present invention are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A high capacitance memory device, comprising: a printed circuit board, provided with a plurality of metal connection pads; at least one capacitor core, simultaneously arranged on different surfaces of the printed circuit board, the at least one capacitor core having connection pins and being electrically connected to the plurality of metal connection pads via a conductive glue; at least one adhesive layer, simultaneously covering the at least one capacitor core on the different surfaces of the printed circuit board; and a memory module, arranged on the printed circuit board and electrically connected to the at least one capacitor core.

2. The high capacitance memory device according to claim 1, wherein the adhesive layer is an epoxy resin.

3. The high capacitance memory device according to claim 1, wherein the at least one capacitor core is arranged by means of Chip On Board (COB) on the printed circuit board.

4. The high capacitance memory device according to claim 1, wherein the printed circuit board is further provided thereon with a power control module, which is covered along with the at least one capacitor core by the adhesive layer.

5. The high capacitance memory device according to claim 1, further comprising a heat sink in contact with surfaces of the memory module and the adhesive layer.

6. The high capacitance memory device according to claim 1, wherein a material of the conductive glue is selected from a group consisting of silver glue, copper glue, tin glue, and platinum glue.

7. The high capacitance memory device according to claim 1, wherein the at least one capacitor core is respectively arranged on different surfaces of the printed circuit board.

* * * * *